United States Patent [19]

Draxelmayr et al.

[11] Patent Number: 4,922,252

[45] Date of Patent: May 1, 1990

[54] ANALOG/DIGITAL CONVERTER WITH CAPACITOR NETWORK

[75] Inventors: Dieter Draxelmayr; Gerold Schrittesser, both of Villach, Austria

[73] Assignee: Siemens Aktiengesellschaft, Berlin and Munich, Fed. Rep. of Germany

[21] Appl. No.: 91,537

[22] Filed: Aug. 31, 1987

[30] Foreign Application Priority Data

Sep. 1, 1986 [DE] Fed. Rep. of Germany ....... 3629737

[51] Int. Cl.$^5$ ............................................. H03M 1/36
[52] U.S. Cl. ................................... 341/172; 341/120; 341/159
[58] Field of Search ................ 340/347 AD, 347 DA; 341/120, 159, 161, 165, 172

[56] References Cited

U.S. PATENT DOCUMENTS

| | | | |
|---|---|---|---|
| 4,129,863 | 12/1978 | Gray et al. | 341/172 |
| 4,195,282 | 3/1980 | Cameron | 340/347 AD |
| 4,200,863 | 4/1980 | Hodges | 340/347 AD |
| 4,295,089 | 10/1981 | Cooperman | 340/347 AD |
| 4,399,426 | 8/1983 | Tan | 340/347 AD |
| 4,517,549 | 5/1985 | Tsukakashi | 341/172 |
| 4,529,965 | 7/1985 | Lee | 341/172 |
| 4,742,330 | 5/1988 | Doermberg et al. | 341/159 |
| 4,831,381 | 5/1989 | Hester | 341/172 |

FOREIGN PATENT DOCUMENTS

0078608 5/1983 European Pat. Off. .

OTHER PUBLICATIONS

IEEE Journal of Solid-State Circuits, vol. SC-14, No. 6, Dec. 1979, pp. 926-932.
Electronic Engineering, vol. 51, No. 632, Dec. 1979, pp. 32-37.

Primary Examiner—William M. Shoop, Jr.
Assistant Examiner—Gary J. Romano
Attorney, Agent, or Firm—Herbert L. Lerner; Laurence A. Greenberg

[57] ABSTRACT

An analog/digital converter operating on the principle of charge distribution includes a capacitor network having dual-weighted capacitors including two smallest capacitors. The capacitors each have two terminals. A comparator has a first input connected to one of the terminals of each of the capacitors and a second input and a reference switch is connected between each of the one terminals and a first reference potential. Other switches each selectively connect the other of the terminals of a respective one of the capacitors to an input analog potential, the first reference potential and a second reference potential. A coupling capacitor is connected upstream of the first input of the comparator.

5 Claims, 1 Drawing Sheet

ANALOG/DIGITAL CONVERTER WITH CAPACITOR NETWORK

The invention relates to an analog/digital converter operating on the principle of charge distribution, including a capacitor network in which the capacitances are dual-weighted and the smallest capacitance is provided twice, one terminal of each of the capacitors is connected to a first input of a comparator and is connected through a reference switch to a reference potential, and the other terminals of the capacitors are connected through a respective other switch to an input analog potential, another reference potential or the first-mentioned reference potential.

An analog/digital converter of this kind, based on the principle of charge distribution with a weighted capacitor network is known, for example, from the book entitled "Elektronische Analog-Digital-Umsetzer" [Electronic Analog/Digital Converters] by D. Seitzer, Springer-Verlag, Berlin, Heidelberg, New York, 1977, pages 55 et seq.

In the above-mentioned publication, it is explained that the conversion of an analog value takes place in a sequence of three operations. In the scanning mode, the capacitors are charged with a charge that is proportional to the analog voltage to be measured; in the holding mode, the switches are switched over such that the analog potential to be measured is present as an amount at the comparator input; and in the redistribution mode, the capacitors are connected successively to a reference potential, so that the bits of the digital word associated with the analog voltage to be converted are available in increments at the comparator output.

The disadvantages of the prior art circuits are that the operation thereof is slow and the implementation of a differential structure is difficult.

It is accordingly an object of the invention to provide an analog/digital converter with a capacitor network, which overcomes the hereinafore-mentioned disadvantages of the heretofore-known devices of this general type and which operates on the principle of charge distribution with a weighted capacitor network, the time response of which is improved and which is suitable for the implementation of a differential structure at little cost.

With the foregoing and other objects in view there is provided, in accordance with the invention, an analog/digital converter operating on the principle of charge distribution, comprising a capacitor network having dual-weighted capacitors including two smallest capacitors, the capacitors each having two terminals, a comparator having a first input connected to one of the terminals of each of the capacitors and having a second input, a reference switch connected between each of the one terminals and a first reference potential, other switches each selectively connecting the other of the terminals of a respective one of the capacitors to an input analog potential, the first reference potential and a second reference potential, and a coupling capacitor connected upstream of the first input of the comparator.

In accordance with another feature of the invention, there is provided another coupling capacitor connected upstream of the second input of the comparator.

In accordance with a further feature of the invention, the other coupling capacitor has a capacitance determined substantially by the capacitance of a series circuit of the first-mentioned coupling capacitor and the capacitor network.

In accordance with an added feature of the invention, there is provided a simulation switch configuration connected to the other coupling capacitor for controlling the second input of the comparator along with the other coupling capacitor.

In accordance with an concomitant feature of the invention, the capacitor network is disposed in a converter branch, and the simulation switch configuration includes means for selectively simulating an entire switch resistance and switching operations of the converter branch, the switch configuration being connected to a potential, preferably the first reference potential.

Other features which are considered as characteristic for the invention are set forth in the appended claims.

Although the invention is illustrated and described herein as embodied in an analog/digital converter with a capacitor network, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

Figure 1:
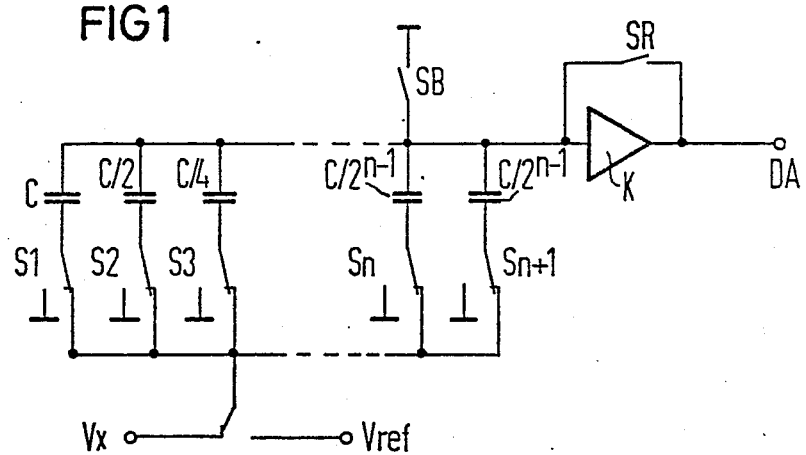
FIG. 1 is a schematic circuit diagram of a prior art analog/digital converter.

Referring now in detail to the figures of the drawings in which identical elements are provided with identical reference numerals and first, particularly, to FIG. 1 thereof, there is seen an embodiment of the type of prior art circuit described above. The circuit includes capacitors designated according to the dual weighting thereof with reference symbols $C, C/2, \ldots C/2^{n-1}$. The total capacitance of the capacitors is $2C$ and the total number of capacitors is one more than the number of dual locations to be formed, because the smallest capacitance appears twice. One terminal of each of the capacitors are connected to one input of a comparator K and through a switch SB to a first reference, standard or normal potential. The other terminals of the capacitors are connected through switches $S1, S2, \ldots Sn$ and $Sn+1$, either to the first reference potential or to a bus bar, and the bus bar is connected through an additional switch either to an analog potential Vx to be measured or to a second reference potential Vref. In the embodiment illustrated in FIG. 1, the comparator K is provided with a feedback circuit that can be connected through a switch SR, but it may also be wired in some other way. The output of the comparator forms a digital output DA of the converter.

As shown in FIG. 1, the entire capacitor network is connected directed to the input of the comparator. For offset compensation of the comparator, the entire capacitor network must first be charged, and as a result the analog/digital converter operates relatively slowly. In order to implement a differential analog/digital converter, a capacitor network must also be connected to the other input of the comparator, for the sake of symmetry.

Figure 2:
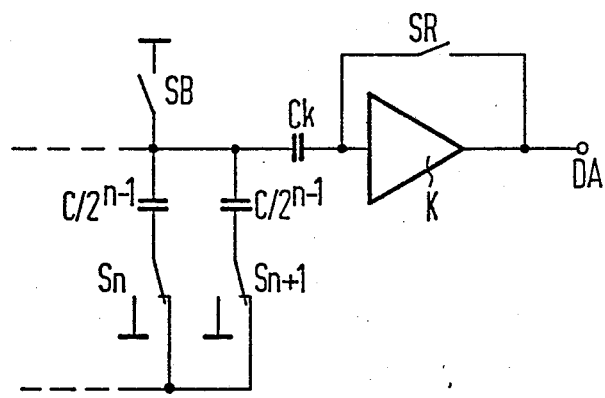
FIG. 2 is a fragmentary relevant circuit of an analog/digital converter according to the invention.

FIG. 2 differs from the corresponding circuit portion of FIG. 1 in that a coupling capacitor Ck is connected to the input side of the comparator K in accordance with the invention. On one hand, the coupling capacitor permits an improvement of the time response of the analog/digital converter according to the invention. This is because in offset compensation of the comparator, the entire capacitor network need no longer be charged; instead, only the coupling capacitor Ck in series with the capacitor network has to be charged. With a series connection of capacitors, it is known that a substitute capacitance is obtained, which is smaller than the smallest single capacitance, and in the illustrated embodiment the capacitor network must be considered as one capacitor, for instance as a total capacitance 2C.

Figure 3:
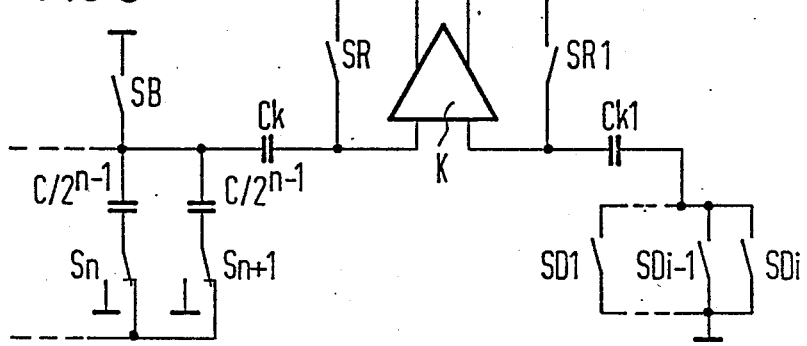
FIG. 3 is a fragmentary circuit of an embodiment of a differential analog/digital converter according to the invention.

On the other hand, the coupling capacitor Ck permits simple implementation of a differential structure, such as is shown in a partial circuit in the embodiment illustrated in FIG. 3. In the FIG. 3 embodiment, a first input of the comparator K is connected in accordance with the partial circuit shown in FIG. 2. In accordance with the invention, one end of another coupling capacitor Ck1 is connected to the second input of the comparator K and the other end of the other coupling capacitor is connected through a simulation switch configuration SD1-SDi to a common potential, preferably the first reference potential of the analog/digital converter. The simulation switch configuration, which includes switches SD1 through SDi, serves to simulate the complex circuit branch having the capacitor network at the first input of the comparator. With the aid of the simulation switch configuration and the additional coupling capacitor Ck1, for example, either the entire switch resistance or individual switching operations of the circuit branch having the capacitor network, can be simulated at the second input of the comparator. Without this further coupling capacitor Ck1, the second input of the comparator would also have to be connected with a capacitor network, for the sake of symmetry. By comparison, a substantially smaller capacitance is sufficient for the coupling capacitor Ck1 connected in series upstream of the second input of the comparator, so that the cost for implementing this differential structure becomes substantially less.

We claim:

1. Analog/digital converter operating on the principle of charge distribution, comprising a capacitor network having dual-weighted capacitors including two smallest capacitors, said capacitors each having two terminals, a comparator having a first input and a second input, a reference switch connected between each of one of said two terminals and a first reference potential, other switches each selectively connecting the other one of said two terminals of a respective one of said capacitors to an input analog potential and the first reference potential; and including a second reference potential, and including a coupling capacitor connected between said one of said terminals of each of said capacitors and said first input of said comparator and another coupling capacitor connected in series with said second input of said comparator.

2. Analog/digital converter according to claim 1, wherein said other coupling capacitor has a capacitance determined substantially by the capacitance of a series circuit of said first-mentioned coupling capacitor and said capacitor network.

3. Analog/digital converter according to claim 1, including a simulation switch configuration connected to said other coupling capacitor for controlling said second input of said comparator along with said other coupling capacitor.

4. Analog/digital converter according to claim 3, wherein said capacitor network is disposed in a converter branch, and said simulation switch configuration includes means for selectively simulating an entire switch resistance and switching operations of said converter branch, said switch configuration being connected to a potential.

5. Analog/digital converter according to claim 4, wherein said potential connected to said switch configuration is said first reference potential.

* * * * *